United States Patent
Jairath et al.

(10) Patent No.: US 6,261,155 B1
(45) Date of Patent: *Jul. 17, 2001

(54) METHOD AND APPARATUS FOR IN-SITU END-POINT DETECTION AND OPTIMIZATION OF A CHEMICAL-MECHANICAL POLISHING PROCESS USING A LINEAR POLISHER

(75) Inventors: Rahul Jairath, San Jose; Jiri Pecen, Palo Alto, both of CA (US); Saket Chadda, Colorado Springs, CO (US); Wilbur C. Krusell, Palo Alto, CA (US); Jerauld J. Cutini, Los Gatos, CA (US); Erik H. Engdahl, Livermore, CA (US)

(73) Assignee: LAM Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/527,171

(22) Filed: Mar. 16, 2000

Related U.S. Application Data

(62) Division of application No. 08/869,655, filed on May 28, 1997, now Pat. No. 6,146,248.

(51) Int. Cl.[7] ................................................. B24B 1/00
(52) U.S. Cl. ........................... 451/41; 451/6; 451/9; 451/10; 451/288
(58) Field of Search ............................ 451/6, 9, 10, 41, 451/285–289, 296, 307, 303

(56) References Cited

U.S. PATENT DOCUMENTS

| | | |
|---|---|---|
| 3,841,031 | 10/1974 | Walsh . |
| 4,193,226 | 3/1980 | Gill, Jr. et al. . |
| 4,308,586 | 12/1981 | Coates . |
| 4,462,860 | 7/1984 | Szmanda . |

(List continued on next page.)

FOREIGN PATENT DOCUMENTS

| | | |
|---|---|---|
| 0 481 935 A2 | 10/1991 | (EP) . |
| 0663265 | 7/1995 | (EP) . |
| 0 706 857 A1 | 10/1995 | (EP) . |
| 0 738 561 A1 | 10/1996 | (EP) . |
| 806266A2 | 11/1997 | (EP) . |
| 824995A1 | 2/1998 | (EP) . |
| 3234467 | 10/1991 | (JP) . |
| 07052032 | 2/1995 | (JP) . |
| 8-240413 | 9/1996 | (JP) . |
| 9-85611 | 3/1997 | (JP) . |
| WO 94/04599 | 3/1994 | (WO) . |
| WO 95/18353 | 6/1995 | (WO) . |
| WO 96/36459 | 5/1996 | (WO) . |
| WO98114306 | 4/1998 | (WO) . |

OTHER PUBLICATIONS

European Search Report and Annex with "Lack of Unity of Invention—Sheet B" for EP98304242.

(List continued on next page.)

*Primary Examiner*—Joseph J. Hail, III
*Assistant Examiner*—George Nguyen
(74) *Attorney, Agent, or Firm*—Brinks Hofer Gilson & Lione

(57) ABSTRACT

A linear polishing belt for use in chemical-mechanical polishing (CMP) of a substrate comprises an opening and a flexible monitoring window secured to the belt to close the opening and to create a monitoring channel in the belt. A plurality of monitoring channels can also be used. A film thickness monitor comprising an interferometer can be disposed alongside the belt or at least partially within a region bound by it. The monitoring channel and the film thickness monitor can be used in the CMP process to determine the end point of the CMP process, determine removal rate at any given circumference of a substrate, determine average removal rate across a substrate surface, determine removal rate variation across a substrate surface, and optimize removal rate and uniformity.

20 Claims, 3 Drawing Sheets

U.S. PATENT DOCUMENTS

| | | |
|---|---|---|
| 4,516,855 | 5/1985 | Korth . |
| 4,647,207 | 3/1987 | Bjork et al. . |
| 4,653,924 | 3/1987 | Itonaga et al. . |
| 4,681,450 | 7/1987 | Azzam . |
| 4,710,030 | 12/1987 | Tauc et al. . |
| 4,776,695 | 10/1988 | Van Pham et al. . |
| 4,793,895 | 12/1988 | Kaanta et al. . |
| 4,811,522 | 3/1989 | Gill, Jr. . |
| 4,844,617 | 7/1989 | Kelderman et al. . |
| 4,927,432 | 5/1990 | Budinger et al. . |
| 4,954,141 | 9/1990 | Takiyama et al. . |
| 4,957,368 | 9/1990 | Smith . |
| 5,020,283 | 6/1991 | Tuttle . |
| 5,036,015 | 7/1991 | Sandhu et al. . |
| 5,042,951 | 8/1991 | Gold et al. . |
| 5,061,072 | 10/1991 | Folkard et al. . |
| 5,067,805 | 11/1991 | Corle et al. . |
| 5,081,421 | 1/1992 | Miller et al. . |
| 5,081,796 | 1/1992 | Schultz . |
| 5,166,752 | 11/1992 | Spanier et al. . |
| 5,177,908 | 1/1993 | Tuttle . |
| 5,197,999 | 3/1993 | Thomas . |
| 5,213,655 | 5/1993 | Leach et al. . |
| 5,240,552 | 8/1993 | Yu et al. . |
| 5,297,364 | 3/1994 | Tuttle . |
| 5,298,110 | 3/1994 | Schoenborn et al. . |
| 5,306,916 | 4/1994 | Norton et al. . |
| 5,308,438 | 5/1994 | Cote et al. . |
| 5,321,304 | 6/1994 | Rostoker . |
| 5,329,732 | 7/1994 | Karlsrud et al. . |
| 5,337,015 | 8/1994 | Lustig et al. . |
| 5,413,941 | 5/1995 | Koos et al. . |
| 5,433,650 | 7/1995 | Winebarger . |
| 5,433,651 | 7/1995 | Lustig et al. . |
| 5,439,551 | 8/1995 | Meikle et al. . |
| 5,461,007 | 10/1995 | Kobayashi . |
| 5,486,129 | 1/1996 | Sandhu et al. . |
| 5,486,701 | 1/1996 | Norton et al. . |
| 5,489,233 | 2/1996 | Cook et al. . |
| 5,517,312 | 5/1996 | Finarov . |
| 5,554,064 | 9/1996 | Breivogel et al. . |
| 5,558,568 | 9/1996 | Talieh et al. . |
| 5,593,344 * | 1/1997 | Weldon et al. .............. 451/296 |
| 5,595,526 | 1/1997 | Yau et al. . |
| 5,597,442 | 1/1997 | Chen et al. . |
| 5,605,760 | 2/1997 | Roberts . |
| 5,609,511 | 3/1997 | Moriyama et al. . |
| 5,609,517 | 3/1997 | Lofaro . |
| 5,643,044 | 7/1997 | Lund . |
| 5,658,183 | 8/1997 | Sandju et al. . |
| 5,700,180 | 12/1997 | Sandhu et al. . |
| 5,722,877 | 3/1998 | Meyer et al. . |
| 5,762,536 | 6/1998 | Pant et al. . |
| 5,800,248 * | 9/1998 | Pant et al. .............. 351/41 |
| 5,816,891 | 10/1998 | Woo . |
| 5,838,447 | 11/1998 | Hiyama et al. . |
| 5,893,796 | 4/1999 | Birang et al. . |
| 5,916,012 | 6/1999 | Pant et al. . |
| 5,934,974 | 8/1999 | Tzeng . |
| 5,961,372 | 10/1999 | Shendon . |
| 6,000,996 | 12/1999 | Fujiwara . |
| 6,018,091 * | 8/2000 | Pecen et al. .............. 356/381 |
| 6,146,248 * | 11/2000 | Jairath et al. .............. 451/41 |

OTHER PUBLICATIONS

European Search Report and Annex for EP98304212.

European Search Report for European Patent Application EP98304224.3,(3 pages).

Hariharan, P., "Optical Interferometry" Academic Press, Sydney, pp. V–XI, 1–9, 37–95 (1985).

Steel, W.H., "Interferometry," Cambridge University Press, Cambridge, pp. V–XI, 26–59, 232–251 (1983).

T. Cleary and C. Barnes, "Orbital Polishing Techniques for CMP," Proceedings of 1996 VMIC Conference, p. 443 (Jun. 1996).

Holger, Grahn, Maris & Tauc, "Picosecond Ultrasonics," IEEE Journal of Quantum Electronics, vol. 25, No. 12, pp. 2562–2569 (Dec. 1989).

Parikh et al., "Oxide CMP on High–Throughput Orbital Polisher," Feb. 13–14, 1997 CMP–MIC Conference.

Fanton, et al., "Multiparameter Measurements of Thin Films Using Beam–Profile Reflectometry," Journal of Applied Physics, vol. 73, No. 11, pp. 7035–7040 Jun. 1, 1993.

Fanton, et al., "A Novel Technique for Performing Ellipsometric Measurements in a Sub–Micrometer Area."

OPTI–PROBE™ Brochure, Therma–Wave, Inc., 1995.

European Search Report for EP 98 30 4242.

* cited by examiner

METHOD AND APPARATUS FOR IN-SITU END-POINT DETECTION AND OPTIMIZATION OF A CHEMICAL-MECHANICAL POLISHING PROCESS USING A LINEAR POLISHER

This application is a division of application Ser. No. 08/869,655, filed May 28, 1997 (now U.S. Pat. No. 6,146, 248), which is hereby incorporated by reference.

BACKGROUND OF THE INVENTION

The present invention relates to the field of semiconductor substrate processing and, more particularly, to the monitoring of material being removed during chemical-mechanical polishing of a semiconductor substrate.

The manufacture of an integrated circuit device requires the formation of various layers (both conductive, semiconductive, and non-conductive) above a base substrate to form necessary components and interconnects. During the manufacturing process, removal of a certain layer or portions of a layer must be achieved in order to planarize or in order to form the various components and interconnects. Chemical-mechanical polishing (CMP) is being extensively pursued to planarize a surface of a semiconductor substrate, such as a silicon substrate, at various stages of integrated circuit processing. It is also used in polishing optical surfaces, meteorology samples, micro-machinery, and various metal and semiconductor based substrates.

CMP is a technique in which a polishing agent is used along with a polishing pad to polish away materials on a semiconductor substrate. The mechanical movement of the pad relative to the substrate, in combination with the chemical reaction of the polishing agent, provides an abrasive force with chemical erosion to planarize the exposed surface of the substrate (or a layer formed on the substrate).

In the most common method of performing CMP, a rotating wafer holder supports a wafer, and a polishing pad rotates relative to the wafer surface. The wafer holder presses the wafer surface against the polishing pad during the planarization process and rotates the wafer about a first axis relative to the polishing pad (see, for example, U.S. Pat. No. 5,329,732). The mechanical force for polishing is derived from the speed of the polishing pad rotating about a second axis different from the first and the downward force of the wafer holder. A polishing agent is constantly transferred under the wafer holder, and rotation of the wafer holder aids in polishing agent delivery and in averaging out local variations across the wafer. Since the polishing rate applied to the wafer surface is proportional to the relative velocity between the substrate and the polishing pad, the polish rate at a selected point on the wafer surface depends upon the distance of the selected point from the two primary axes of rotation—that of the wafer holder and that of the polish pad. This results in a non-uniform velocity profile across the surface of the substrate, and therefore, in a non-uniform polish Additionally, it is generally accepted by those experienced in the art of CMP that a higher relative velocity between the wafer and the polish pad is desired for superior planarization performance (see, for example, Stell et al., in "Advanced Metallization for Devices and Circuits—Science, Technology and Manufacturability" ed. S. P. Murarka, A. Katz, K. N. Tu and K. Maex, pg 151). However, a higher average relative velocity in this configuration leads to a less desirable velocity profile across the surface of the substrate, and therefore, poor uniformity of polish.

This problem is solved by using a linear polisher. In a linear polisher, instead of a rotating pad, a belt moves a pad linearly across the substrate surface to provide a more uniform velocity profile across the surface of the substrate. The substrate is still rotated for averaging out local variations as with a rotating polisher. Unlike rotating polishers, however, linear polishers result in a uniform polishing rate across the substrate surface throughout the CMP process for uniformly polishing the substrate.

Additionally, linear polishers are capable of using flexible belts, upon which the pad is disposed. This flexibility allows the belt to flex, which can cause a change in the pad pressure being exerted on the substrate. A fluid bearing formed by a stationary platen can be utilized to control the pad pressure being exerted on a substrate at various locations along the substrate surface, thus controlling the profile of the polishing rate across the substrate surface.

Linear polishers are described in a patent application titled "Control of Chemical-Mechanical Polishing Rate Across A Substrate Surface;" Ser. No. 08/638,464; filed Apr. 26, 1996 and in a patent application titled "Linear Polisher and Method for Semiconductor Wafer Planarization;" Ser. No. 08/759,172; filed Dec. 3, 1996. Fluid bearings are described in a patent application titled "Control Of Chemical-Mechanical Polishing Rate Across A Substrate Surface For A Linear Polisher;" Ser. No. 08/638,462; filed Apr. 26, 1996 and in U.S. Pat. No. 5,558,568.

Rotating CMP systems have been designed to incorporate various in-situ monitoring techniques. For example, U.S. Pat. No. 5,081,421 describes an in-situ monitoring technique where the detection is accomplished by means of capacitively measuring the thickness of the dielectric layer on a conductive substrate. U.S. Pat. Nos. 5,240,552 and 5,439, 551 describe techniques where acoustic waves from the substrate are used to determine end point. U.S. Pat. No. 5,597,442 describes a technique where the end point is detected by monitoring the temperature of the polishing pad with an infrared temperature measuring device. U.S. Pat. No. 5,595,526 describes a technique where a quantity approximately proportional to a share of the total energy consumed by the polisher is used to determine end point. U.S. Pat. Nos. 5,413,941, 5,433,651 and European Patent Application No. EP 0 738 561 A1 describe optical methods for determining end point.

In U.S. Pat. No. 5,413,941, a laser light impinges onto an area of the substrate at an angle greater than 70° from a line normal to the substrate, the impinged laser light predominantly reflecting off the area as opposed to transmitting through. The intensity of the reflected light is used as a measure of a change in degree of planarity of the substrate as a result of polishing.

In other systems, the light passes through a single monitoring channel, typically a window in the polishing table and/or pad. For example, in U.S. Pat. No. 5,433,651, the rotating polishing table has a window embedded in it, which is flush with the table as opposed to the polishing pad. As the table rotates, the window passes over an in-situ monitor, which takes a reflectance measurement indicative of the end point of the polishing process. In European Patent Application No. EP 0 738 561 A1, the rotating polishing table has a window embedded in it, which, unlike the one in the '651 patent, is flush with or formed from the polishing pad. A laser interferometer is used as the window passes over an in-situ monitor to determine the end point of the polishing process.

It is important to note that in these two systems only one monitoring channel is used and that this single channel moves along with the polishing element and platen. Additionally, the window used in the monitoring channel of these systems is not required to be flexible, since the window and polishing platen and/or pad rotate in one plane.

While rotating platen CMP systems have been designed to incorporate in-situ monitoring techniques, there is a need for a linear polisher capable of in-situ monitoring of a substrate surface and for optimizing the chemical-mechanical polishing process.

SUMMARY OF THE INVENTION

This invention relates to chemical-mechanical polishing (CMP) of a substrate using a linear planarization tool and a film thickness monitor for end point detection and optimization of the CMP process.

According to a first aspect of the invention, a linear polishing belt has an opening placed in it. A monitoring window is secured to the belt to close the opening and to create a monitoring channel in the belt. The monitoring window comprises a flexible material adapted to flex with the belt as the belt moves in use. Alternatively, the belt may itself be such that it allows for monitoring the surface condition of the substrate being polished.

According to a second aspect of the invention, the above-described belt is used in a linear CMP device. A film thickness monitor, such as an interferometer, views the substrate through the monitoring window to determine the end point of the CMP process. The film thickness monitor can be disposed alongside the belt or at least partially within a region bound by it. A plurality of monitoring channels can also be used.

According to a third aspect of the invention, the linear polishing belt is used in a method for determining an end point of the CMP process by repeatedly measuring film thickness of a substrate to determine whether a predefined thickness has been reached, in which case the fact that end point has been reached can be indicated and the CMP process can be terminated.

According to a fourth aspect of the invention, the linear polishing belt is used in a method for determining removal rate at any given circumference of a substrate while performing CMP by determining the difference between two consecutive film thickness measurements made through the same monitoring channel in the belt.

According to a fifth aspect of the invention, the linear polishing belt is used in a method for determining average removal rate across a substrate surface while performing CMP by determining the average of the differences between at least two consecutive film thickness measurements taken by at least two film thickness monitoring devices.

According to a sixth aspect of the invention, the linear polishing belt is used in a method for determining removal rate variation across a substrate surface while performing CMP by determining the variation of the differences between at least two consecutive film thickness measurements taken by at least two film thickness monitoring devices.

According to a seventh aspect of the invention, the linear polishing belt is used in a method for optimizing the CMP process by characterizing a polishing process to determine effects of processing parameters; and then determining removal rate and removal rate variation; and then adjusting the polishing process parameters to optimize the removal rate and uniformity.

DETAILED DESCRIPTION OF THE PRESENTLY PREFERRED EMBODIMENTS

Figure 1:
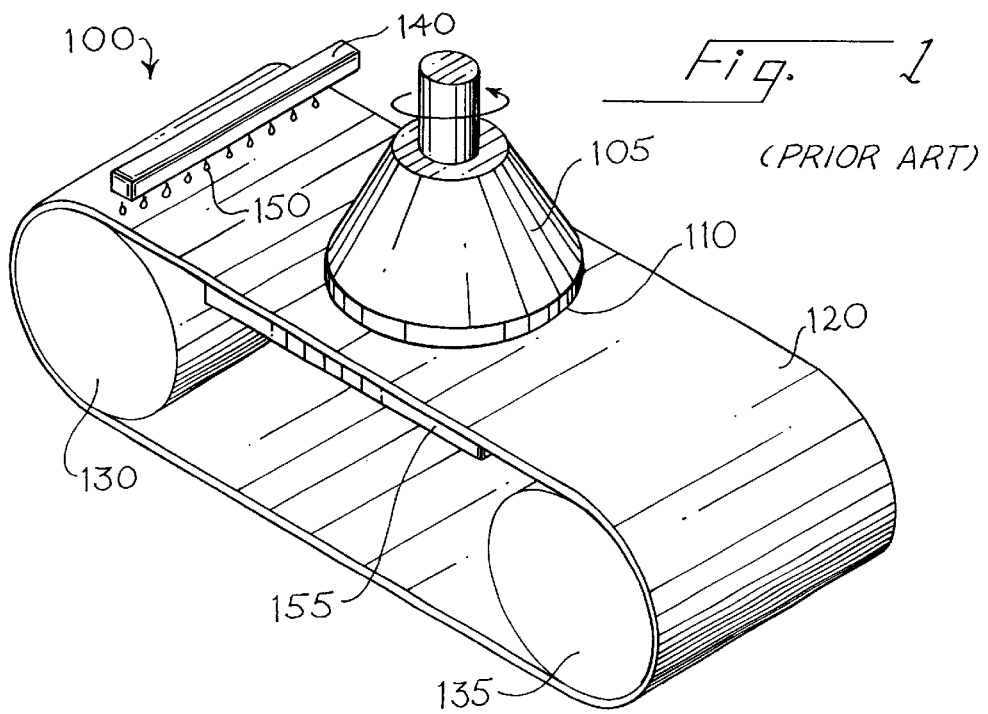
FIG. 1 is a schematic view of a prior-art linear polisher.

Turning now to the drawings, FIG. 1 illustrates a prior art linear polisher 100 utilized in planarizing a substrate (not shown) through a technique generally known in the art as chemical-mechanical polishing (CMP). As shown in this figure, the linear polisher 100 has a substrate carrier 110 attached to a polishing head 105 that secures the substrate. The substrate is positioned on a belt 120, which moves about first and second rollers 130 and 135. As used herein, "belt" refers to a closed-loop element comprising at least one layer, at least one layer is a layer of polishing material. A discussion of the layer(s) of the belt element is developed below.

A polishing agent dispensing mechanism 140 provides a polishing agent 150 on top of the belt 120. The polishing agent 150 moves under the substrate along with the belt 120 and may be in partial or complete contact with the substrate at any instant in time during the polish process. A platen 155 supports the belt 120 under the substrate carrier 110.

Generally, the substrate carrier 110 rotates the substrate over the belt 120. A mechanical retaining means, such as a retainer ring and/or a vacuum typically holds the substrate in place.

The belt 120 is continuous and rotates about the rollers 130, 135. Driving means, such as a motor (not shown), rotate the rollers 130, 135, causing the belt 120 to move in a linear motion with respect to the surface of the substrate.

As the belt 120 moves in a linear direction, the polishing agent dispensing mechanism 140 provides polishing agent 150 to the belt 120. A conditioner (not shown) is typically used to recondition the belt 120 during use by constantly scratching the belt 120 to remove polishing agent residue build-up and/or pad deformation.

The belt 120 moves between the platen 155 and the substrate, as shown in FIG. 1. A primary purpose of platen 155 is to provide a supporting platform on the underside of the belt 120 to ensure that the belt 120 makes sufficient contact with the substrate for uniform polishing. Typically, the substrate carrier 110 presses downward against the belt 120 with appropriate force, so that the belt 120 makes sufficient contact with the substrate for performing CMP. Since the belt 120 is flexible and will depress when the substrate presses downward onto it, the platen 155 provides a necessary counteracting support to this downward force.

The platen 155 can be a solid platform or it can be a fluid bearing (which includes one or more fluid channels). A fluid bearing is preferred because the fluid flow from the platen 155 can be used to control forces exerted against the underside of the belt 120. By such fluid flow control, pressure variations exerted by the belt 120 on the substrate can be controlled to provide a more uniform polishing rate of the substrate. Examples of fluid bearings are disclosed in the aforementioned patent applications and in U.S. Pat. No. 5,558,568, each incorporated by reference.

First Preferred Embodiment

Figure 2:
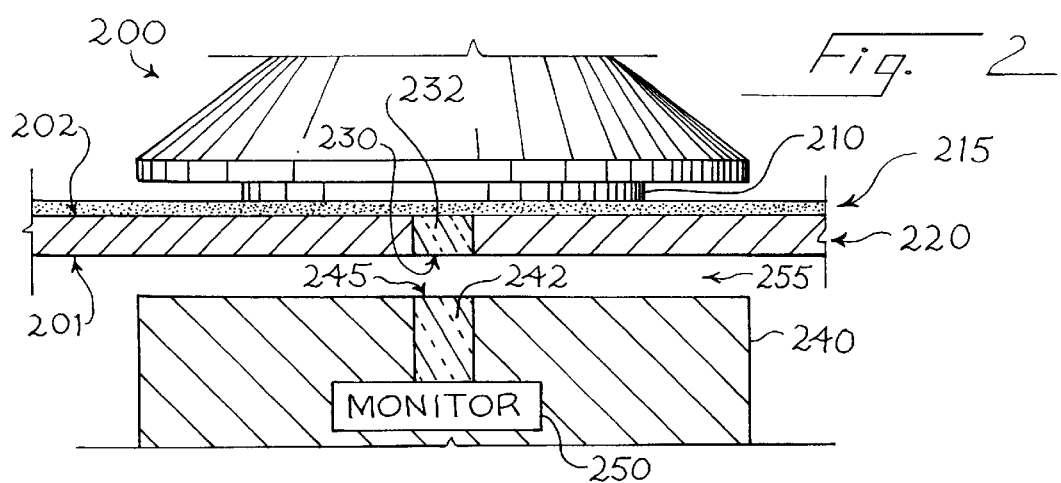
FIG. 2 is a cross-sectional view of a linear polisher of a first preferred embodiment.

FIG. 2 shows a cross section of a first preferred embodiment of the present invention, which represents an improvement to the prior-art linear polisher 100 described above. As in the prior-art embodiment, the linear polisher 200 of FIG. 2 comprises a substrate carrier 210, a layer of polishing agent 215, a belt 220, and a platen 240 for performing CMP on a substrate (not shown). The belt 220 has a layer of polishing material (not shown), an inner surface 201, and an outer surface 202. (The composition of the belt 220 is described in more detail below.) New to this embodiment is an opening 230 in the belt 220 (extending from its inner surface 201 to its outer surface 202) and an opening 245 in the platen 240. Additionally, a layer of liquid mist such as that of de-ionized water 255 lies between the belt 220 and the platen 240.

This embodiment performs CMP in the same way as the prior-art linear polisher 100 described above. Unlike the above-described polisher 100, this polisher 200 can be used with an in-situ film thickness monitor 250. Unlike the in-situ monitors used in some of the rotating platen systems, two monitoring channels are used in this embodiment—one that is stationary in the platen and one that moves with the polishing belt.

As the belt 220 moves linearly under the substrate during the CMP process, the opening 230 in the belt 220 passes over the opening 245 in the platen 240. When the openings 230, 245 align (as shown in FIG. 2), an optical circuit is completed between the substrate and the film thickness monitor 250, and in-situ monitoring can be performed. The monitoring process will be discussed in greater detail below.

While they can be left open, the openings 230, 245 in the belt 220 and the platen 240 have monitoring windows 232, 242 embedded in them. The monitoring window 232 in the belt 220 is substantially transparent to light within a selected range of optical wavelengths and extends completely or partially between the inner 201 and outer 202 surfaces of the belt 220. Generally, the monitoring window 232 in the belt 220 ensures that no polishing agent 215 or water leaks to the underside of the belt 220. By being flush with the outer surface 202 of the belt 220, implications with the polishing process are avoided. By being flush with the inner surface 201 of the belt 220, the creation of turbulent regimes in the fluid bearing of the platen 240 is avoided (though, it could be just a little raised or recessed).

Unlike the windows in the prior art, rotating platen systems, the monitoring window 232 should also be flexible enough to ride over the rollers (which can range from 2 to 40 inches in diameter) moving the belt 220 and should be made of a material that will have a minimum effect on the polishing results due to its presence. Depending on the monitoring system used, the monitoring window 232 may also need a particular optical characteristic (e.g., maximum transmission of radiation from about 200 nm up to about 2000 nm in wavelength with minimum absorption or scattering).

The monitoring window 242 filling the opening 245 in the platen 240 is preferably flush with the top surface of the platen 240 to prevent polishing agent from flowing into the film thickness monitor 250 and to avoid creation of turbulent regions in the fluid bearing of the platen 240. As with the monitoring window 232 in the belt 220, the monitoring window 242 in the platen 240 preferably provides desired optical characteristics (e.g., maximum transmission of the spectrum of light being generated from the monitor 250 and reflected from the surface of the substrate).

Second Preferred Embodiment

Figure 3:
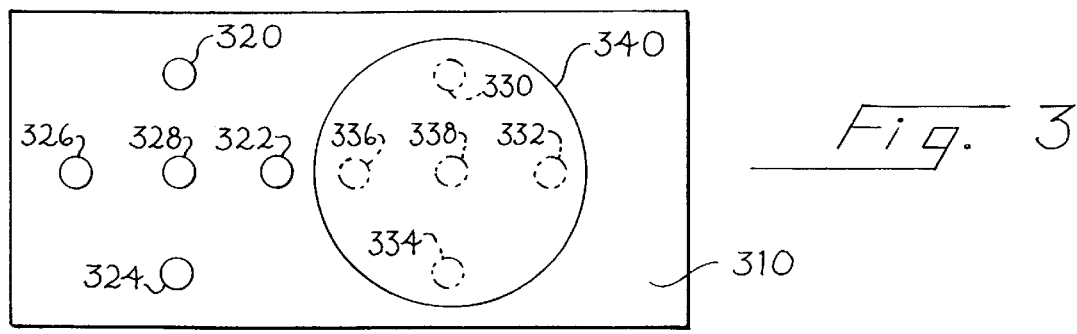
FIG. 3 is a plan view showing a placement of openings in a platen and a pattern of openings on a belt to align with the openings in the platen.

While the belt 220 of the above embodiment contains only one opening, a plurality of openings can be used. As shown in FIG. 3, the belt 310 can contain a plurality of openings 320, 322, 324, 326, 328. For each opening 320, 322, 324, 326, 328 in the belt 310, there is a corresponding opening 330, 332, 334, 336, 338 in the platen under the substrate carrier 340. Each opening 330, 332, 334, 336, 338 is aligned with a respective film thickness monitor. As above, each opening can be closed by a monitoring window.

In this figure, there are five openings, one at the center of the substrate and four arranged at 90 degree intervals. It is appreciated that the number or the pattern of the openings is a design choice. For example, the openings can be linearly or concentrically arranged. With several film thickness monitors distributed under respective locations of the belt 310, non-uniformity of the polishing process across the substrate surface can be ascertained.

Figure 7:
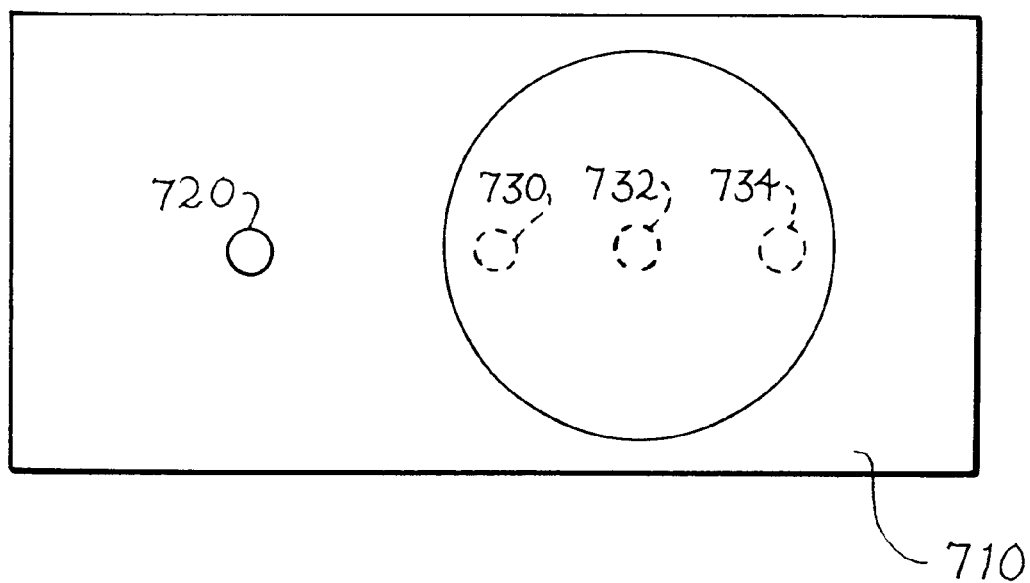
FIG. 7 is a plan view showing a placement of a plurality of openings in a platen and a belt having only one opening.

Alternatively, as FIG. 7 shows, a single opening 720 in the belt 710 can be used with multiple openings 730, 732, 734 in the platen, each opening corresponding to a respective film thickness monitor. As above, each opening can be closed by a monitoring window. The openings 730, 732, 734 in the platen are aligned in a straight line parallel to belt 710 motion. When the belt opening 720 is aligned with one of the openings 730, 732, 734 in the platen, the film thickness monitor corresponding to that platen opening can make a measurement of the surface condition of the polished object. With this arrangement, the condition of multiple areas of the surface can be monitored with a single opening in the belt 710. It is important to note that the number and position of platen openings, as well as the number of straight lines parallel to the belt 710, is a design choice.

Third Preferred Embodiment

Figure 4:
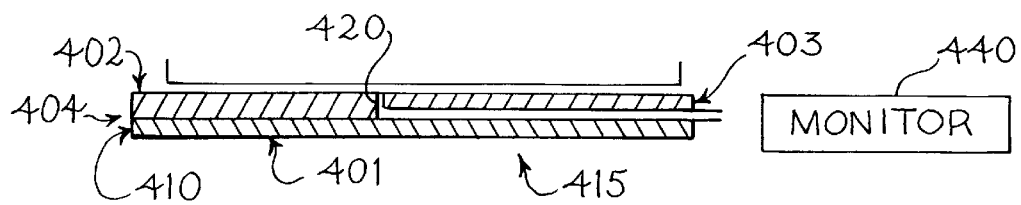
FIG. 4 is a cross-sectional view of a fiber-optic transmission line disposed between two layers of a belt to provide for an extended optical signal path from an outer surface of the belt to a first side surface of the belt.

FIG. 4 shows another alternative embodiment. Here, there is no opening in the platen for a monitoring channel. Instead, an opening 420 is formed in the belt 415 for an extended monitoring channel. This figure shows a belt 415 having two layers (one of which is layer 410), an inner surface 401, an outer surface 402, a first side surface 403, and a second side surface 404. The monitoring channel 420 is such that the optical path travels laterally parallel to the upper surface of one layer 410 of the belt 415 from the outer surface 402 to the first side surface 403. A film thickness monitor 440 is positioned adjacent to the first side surface 403 of the belt 415, instead of under the belt 415.

In this embodiment, a monitoring window fills the opening 420 to complete the optical circuit from the substrate to the film thickness monitor 440. This monitoring window can be a flexible fiber optic element.

Figure 5:
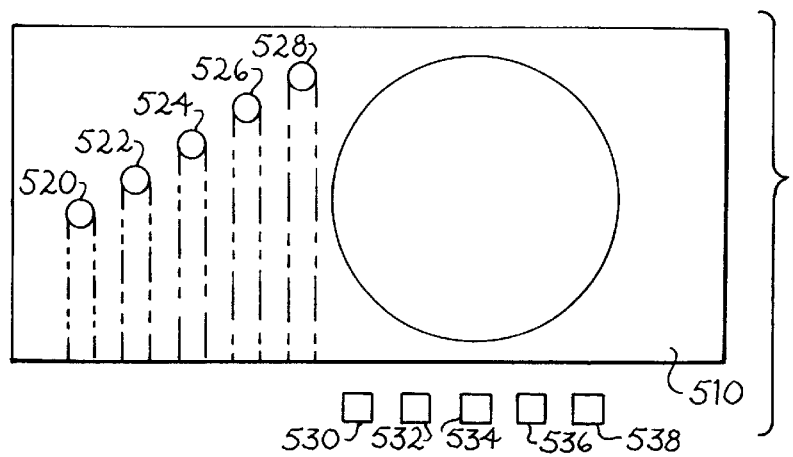
FIG. 5 is a plan view showing a placement of sensing locations in a belt, but not in a platen, in which a fiber optic arrangement of FIG. 4 is employed with multiple film thickness monitors.

As with the embodiments described above, this approach can be implemented with more than one monitoring channel. FIG. 5 shows a plan view of an embodiment having a plurality of monitoring channels 520, 522, 524, 526, 528. Here, a linearly aligned, slanted hole pattern is shown formed on the belt 510. The distal end of the fiber-optic transmission lines are terminated adjacent to a row of film thickness monitors 530, 532, 534, 536, 538 arranged along the side of the linearly moving belt 510. In this arrangement, the positions of the film thickness monitors can be adjusted to align with the optic fibers, since the film thickness monitors can be made movable. Thus, this embodiment allows for less stringent requirement in the placement of the monitoring channels, since adjustments can be made in the positions of the film thickness monitors 530, 532, 534, 536, 538.

Figure 6:
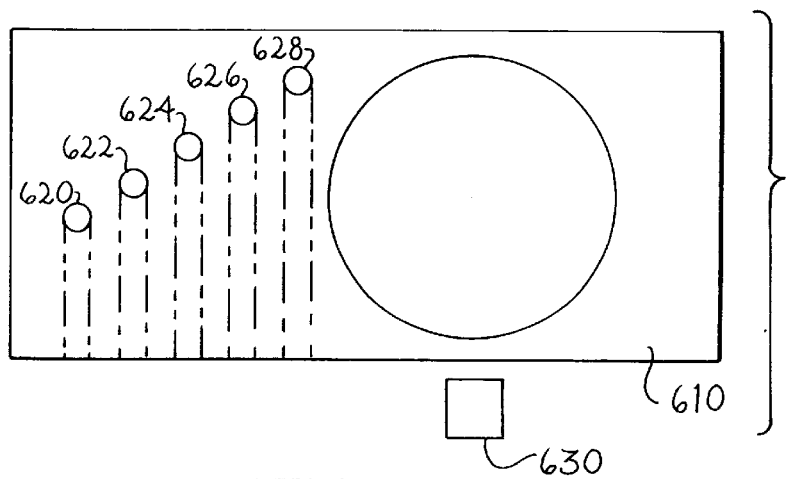
FIG. 6 is a plan view showing a placement of sensing locations in a belt, but not in a platen, in which a fiber optic arrangement of FIG. 4 is employed with only one film thickness monitor.

While a plurality of film thickness monitors are shown in FIG. 5, a single film thickness monitor 630 can be used, as FIG. 6 illustrates. This single film thickness monitor 630 is positioned along side the moving belt 610 and takes the place of multiple film thickness monitors. In this embodiment, the optical-fiber-filled monitoring channels 620, 622, 624, 626, 628 can be made to traverse across the film thickness monitor 630 in a linear arrangement. Although detection cannot be performed simultaneously in multiple monitoring channels, as when multiple film thickness monitors are utilized, data can still be obtained for each monitoring channel.

It is important to note that in the above alternatives, the monitoring channel can either extend from the outer to the first side surface (in which case the monitor can be positioned along the side of the belt) or extend from the outer surface to the inner surface of the belt (in which case the monitor can be at least partially disposed within the belt). It is also important to note that the pattern of openings on the belt may be repeated more than once in order to obtain multiple measurements per belt rotation. This provides more data points per unit time, thereby improving the quality of the results obtained.

Best Mode and Belt Construction

Using a fluid bearing (preferably air) is more advantageous than using a solid platen, since monitoring data can be used to adjust the fluid pressure at varying locations of the platen to provide in-situ correction during the polishing process. It is preferred that the platen have about 1–30 fluid flow channels. It is also preferred that a pre-wet layer of de-ionized water mist be used between the platen and the belt to sweep away any polishing agent that happens to come underneath the belt, preventing blockage of the flow channels.

The monitoring window in the platen is preferably made from a hard, scratch-resistant material such as sapphire. A sapphire window from the Swiss Jewel Company (Part No. W12.55) is preferred. The monitoring window in the platen is secured in place with an adhesive sufficiently strong to withstand the conditions of the CMP process. It is preferred that the monitoring window have an anti-reflective coating on one or more surfaces.

In using the above embodiments, it is preferred that a carrier film such as that available from Rodel (DF200) be used between the substrate and the substrate carrier. The substrate carrier preferably presses the substrate against the belt with a pressure of about 5 psi.

The polishing agent has a pH of about 1.5 to about 12. One type of polishing agent that can be used is Klebesol available from Hoechst, although other types of polishing agent can be used depending on the application.

During the CMP process, the rollers preferably rotate at a rate so as to provide a belt speed of about 400 ft/min. The belt should be tensioned with a force of about 600 lbs.

As mentioned above, a "belt" comprises at least one layer of material, one of which is a layer of polishing material. There are several ways in which to construct a belt. One way uses a stainless steel belt, which can be purchased from Belt Technologies, having a width of about 14 inches and a length of about 93.7 inches, inner diameter. (In addition to stainless steel, a base layer selected from the group consisting of aramid, cotton, metal, metal alloys, or polymers can be used.) The preferred construction of this multi-layered belt is as follows.

The stainless steel belt is placed on the set of rollers of the CMP machine and is put under about 2,000 lbs of tension. When the stainless steel belt is under tension, a layer of polishing material, preferably Rodel's IC 1000 polishing pad, is placed on the tensioned stainless steel belt. An underpad, preferably made of PVC, is attached to the underside of the stainless steel belt with an adhesive capable of withstanding the conditions of the CMP process. The constructed belt preferably will have a total thickness of about 90 mils: about 50 mils of which is the layer of polishing material, about 20 mils of which is the stainless steel belt, and about 20 mils of which is the PVC underpad.

There are several disadvantages of the above construction method. First, because the stainless steel belt needs to be tensioned on the rollers, there is down time for the CMP machine. Second, this construction requires technicians and time to place the pad on the stainless steel belt.

To overcome these disadvantages, the belt can be formed as one integrated component as described in a patent application titled "Integrated Pad and Belt for Chemical Mechanical Polishing;" Ser. No. 08/800,373, filed Feb. 14, 1997, hereby incorporated by reference. The preferred construction of such an assembly follows.

This belt is formed around a woven Kevlar fabric. It has been found that a 16/3 Kevlar, 1500 Denier fill and a 16/2 cotton, 650 Denier warp provide the best weave characteristics. As is well known in the art, "fill" is yarn in the tension-bearing direction, and "warp" is yarn in the direction perpendicular to the tension bearing direction. "Denier" defines the density and diameter of the mono-filament. The first number represents the number of twists per inch, and the second number refers to the number of filaments that are twisted in an inch.

The woven fabric is placed in a mold that preferably has the same dimensions as the stainless steel belt described above. A clear polyurethane resin (as described in more detail below) is poured into the mold under a vacuum, and the assembly is then baked, de-molded, cured, and ground to the desired dimension. The resin may be mixed with fillers or abrasives in order to achieve desired material properties and/or polishing characteristics. Since fillers and abrasive particles in the polishing layer may scratch the polished article, it is desired that their average particle size be less than about 100 microns. Such a belt can be obtained pre-constructed from Belting Industries.

Instead of molding and baking the woven fabric with polyurethane, a layer of polishing material, preferably a Rodel IC 1000 polishing pad, can be attached to the woven fabric or the preconstructed belt as it was on the stainless steel belt.

In any of these belt constructions, fillers and/or abrasive particles (having an average particle size less than 100 microns) can be dispersed throughout the polishing layer to enable use of lower concentration of abrasive particles in the polishing agent. The reduction of abrasive particle concentration in the polishing agent leads to substantial cost savings (typically, polishing agent costs represent 30–40% of the total cost of CMP processes). It also leads to a reduction in light scattering due to the presence of polishing agent particles. This reduces noise in the signal obtained by the monitor and helps in getting more accurate and repeatable results.

The polishing layer may also comprise a polishing agent transport channel. The polishing agent transport channel is a texture or pattern in the form of grooves (depressions) etched or molded into the surface of the polishing layer. These grooves may be, for example, of rectangular, U-, or V-shape. Typically, these channels are less than 40 mils deep, and less than 1 mm wide at the polishing layer's upper surface. The polishing agent transport channels are typically arranged in a pattern such that they run the length of the polishing surface. However, they may be arranged in any other pattern as well. The presence of these channels greatly enhances the transport of polishing agent between the polishing layer and polish substrate. This leads to improved polishing rates and uniformity across the substrate surface.

With any of the belts described above, a hole may be punched in the belt at the desired location to form the opening. The opening in the belt is preferably ½ inch in width (across the belt) by 3½ inches in length (along the belt).

The monitoring window filling the opening in the belt can be made up of a variety of materials such as urethane, clear polyurethane (solid, filled, blown or extruded), PVC, clear silicone, or many other plastics. It is preferred, however, that clear polyurethane be used, as this material has maximum transmission of radiation from about 200 nm up to about 2000 nm in wavelength with minimum absorption or scattering. A suitable clear urethane resin can be purchased as "Calthane ND 2300 System" and "Calthane ND 3200 System" from Cal Polymers, Inc., 2115 Gaylord St., Long Beach, Calif. The layer of polishing material can be made from a similar material to ensure minimum effect on the polishing results.

The monitoring window can be secured in the opening with an adhesive sufficiently strong to hold the monitoring window in place during the CMP process. The adhesive is preferably 2141 Rubber and Gasket adhesive available from 3M, Minneapolis, Minn.

Alternatively, the monitoring window can be molded directly in the belt. For the belt with a stainless steel layer, the polyurethane resin can be cast in the opening. A casting with a mirror-finished rubber lining can be placed on both sides of the opening during the curing process. For the belt with the woven fabric layer, openings can be made in the woven fabric before placing it in the mold. After the baking process described above, the opening in the belt would contain the polyurethane monitoring window.

As an alternative to placing openings in the belt, each layer of the belt can be partially or completely made of a material substantially transparent to light within a selected range of optical wavelengths, such as about 200 nm to about 2000 nm, eliminating the need to provide a monitoring window in the belt. For example, the fabric may be woven with Kevlar or some other material so as to provide openings in the fabric, or may be constructed with optically clear fiber. Clear polyurethane (or some other clear material) is then molded onto the fabric in a manner described above. This results in a belt assembly that is appropriate for film thickness measurements.

Film Thickness Monitor

In the embodiments described above, a film thickness monitor is used, either disposed at least partially within a region bound by the belt (i.e., in the platen) or disposed alongside the belt. In the former case, the platen is stationary (unlike the prior art rotary systems) with respect to the belt and has an opening formed therein. The monitor can be disposed at least partially within this opening. A second monitoring window can secure to the platen and close the opening. This window can be substantially transparent to light within a selected range of optical wavelengths, such as about 200 nm to about 2000 nm.

During the polishing process, the optical circuit is completed when the monitoring channel in the belt is aligned with the film thickness monitor, as detected by a sensor. The sensor is preferably a short distance diffuse reflex sensor (such as Sunx model number CX-24). The sensor enables the film thickness monitor to measure the surface state of the substrate being polished. Unlike the sensors used in rotary platen system, this sensor does not detect when a wafer is aligned with a single monitoring channel in a moving platen, but rather detects when the monitoring window in the belt is aligned with the film thickness monitor.

The information obtained from the film thickness monitor may be used in several ways. The film thickness monitor can be used to determine the end point of the CMP process. It is important to stop the CMP process upon the removal of the last unwanted layer or when a specified amount of substrate film is left behind. As a consequence, end point detection is necessary and highly desirable to indicate when the last layer has been removed or when a specified amount of substrate film is left behind. During the polish process, a train of film thickness data points is generated each time a monitoring channel in the belt is aligned with a film thickness monitor. When the film thickness reaches the pre-defined desired thickness, end point is reached, and the polish process is terminated. Therefore, the film thickness monitors described below may be used to determine and indicate the end point and may be used to manually or automatically end the CMP process in the above-described embodiments.

A common film thickness monitor used in the prior art utilizes an interferometer. Information about interferometry can be found in the following references: Brown, R. Hanbury "The Intensity Interferometer" Taylor and Francis, London (1974); Hariharan, P. "Optical Interferometry" Academic Press, Sydney (1985); Steel, W. H. "Interferometry" Cambridge University Press, Cambridge (1983).

Several U.S. patents disclose a variety of end point detection systems. U.S. Pat. No. 5,081,796 uses laser interferometry as an end point detection means. U.S. Pat. No. 4,462,860 describes an end point detection system in which interfering reflections produce oscillating signals, which are processed to produce a logical output indicative of end point. End point detection in U.S. Pat. No. 4,776,695 uses a scanning monochrometer to determine end point based on a received reflected light. The system in U.S. Pat. No. 5,433,651 determines end point by measuring the ratio of incident light to reflected light. European Patent Application No. EP 0 738 561 A1 also describes a detection system in which the phase relationship between light reflected from the surface of the substrate and underlying layers is analyzed to determine the end point. Each of these patents is hereby incorporated by reference.

It is important to note that these are merely examples and that any end point detection system and film thickness monitor can be used. For example, thickness can be measured with a film thickness monitor using ellipsometry, beam profile reflectometry, or optical stress generator beam-based techniques (as described in U.S. patent application Ser. No. 08/865,028, U.S. Pat. No. 6,108,091, assigned to the assignee of the present application) or preferably with multi-wavelength spectroscopy (as described in U.S. patent application Ser. No. 08/863,644 assigned to the assignee of the present application), each of which is hereby incorporated by reference.

The above embodiments can be used in a method for determining the end point of the CMP process using a linear belt. When a monitoring channel in the belt aligns with a film thickness monitor, an optical circuit is completed between the film thickness monitor and the substrate. This enables measurement of the surface state of the substrate. Each time a monitoring channel in the belt is aligned with a film thickness monitor, a film thickness measurement is made. Therefore, a sequence of film thickness measurements are made during the polishing process. When the film thickness reaches a predefined thickness, end point is reached and can be indicated, and the polishing process can be terminated.

These embodiments can also be used in a method for determining removal rate at any given circumference of a substrate while performing a chemical-mechanical polishing process using a linear polishing belt. When a monitoring channel in the belt aligns with a film thickness monitor, the film thickness monitor determines a film thickness at any given circumference on the substrate as described above. The difference of two consecutive film thickness measurements made through the same monitoring channel in the belt is the film removal rate per belt revolution. Therefore, for a known belt speed, removal rate of the substrate is determined as thickness per unit time.

This method can also be adapted to determine the removal rate variation and average removal rate across a substrate surface. This is achieved in a similar manner to that described above, but with the use of multiple monitoring channels in the belt or in the platen. In this case, each monitoring channel results in a film thickness measurement at a predefined circumference of the wafer substrate. Therefore, with every belt revolution, multiple film thickness measurements are made across the substrate surface. As described above, each of the measurements is converted into a removal rate. The average and variation of the removal rate across the substrate surface is thus computed. For example, the standard deviation of the measurements is indicative of the removal rate variation across the substrate surface.

Additionally, the information gathered by the film thickness monitor can be used to adjust processing parameters of the linear polisher. First, the polishing process is characterized in order to determine the effects of polish parameters such as polish pressure, belt speed, carrier speed, polishing agent flow, etc. on responses such as substrate removal rate, uniformity, etc. A suitable model may be generated using software such as RS/1 available from BBN Software. During the polishing process, removal rate and removal rate variation across the substrate (uniformity) are determined as described above. This information would then be used in conjunction with the model developed to adjust the polish parameters (such as, but not limited to, down force, belt speed, and carrier speed) in order to optimize the removal rate and/or uniformity. This optimization may happen either in real time or in a delayed manner.

It is important to note that while "substrate" has been used as a working example for the above-described embodiments, any polished object can be used.

It is intended that the foregoing detailed description be understood as an illustration of selected forms that the invention can take and not as a definition of the invention. It is only the following claims, including all equivalents, which are intended to define the scope of this invention.

What is claimed is:

1. A chemical mechanical polishing element comprising a belt comprising a layer of polishing material, the belt formed in a closed loop and being at least partially comprised of a layer of material substantially transparent to light within a selected range of optical wavelengths and adapted to flex as the belt moves in use.

2. The invention of claim 1 wherein the layer of material is substantially transparent to light within the range of about 200 nm to about 2000 nm.

3. The invention of claim 1, wherein the belt comprises a surface comprising polishing agent transport channels.

4. The invention of claim 1, wherein the layer of polishing material comprises a plurality of fillers dispersed throughout the layer of polishing material, the fillers having an average particle size less than about 100 microns.

5. The invention of claim 1, wherein the layer of polishing material comprises a plurality of abrasive particles dispersed throughout the layer of polishing material, the abrasive particles having an average particle size less than about 100 microns.

6. The invention of claim 1, wherein the layer of material substantially transparent to light comprises urethane.

7. In a linear chemical mechanical polishing device of the type comprising: at least two rollers; a belt comprising a layer of polishing material and mounted to extend between the rollers such that rotation of the rollers drives the belt; and a substrate carrier positioned adjacent the belt to press a substrate into contact with the belt intermediate the rollers; the improvement comprising the belt being at least partially comprised of a layer of material substantially transparent to light within a selected range of optical wavelengths and adapted to flex as the belt moves around and between the rollers in use.

8. The invention of claim 7, wherein the layer of material is substantially transparent to light within the range of about 200 nm to about 2000 mn.

9. The invention of claim 7, wherein the belt comprises a surface comprising polishing agent transport channels.

10. The invention of claim 7, wherein the layer of polishing material comprises a plurality of fillers dispersed throughout the layer of polishing material, the fillers having an average particle size less than about 100 microns.

11. The invention of claim 7, wherein the layer of polishing material comprises a plurality of abrasive particles dispersed throughout the layer of polishing material, the abrasive particles having an average particle size less than about 100 microns.

12. The invention of claim 7, wherein the layer of material substantially transparent to light comprises urethane.

13. A method of optimizing a chemical-mechanical polishing process comprising:
 (a) providing a belt having an opening formed therein and a monitoring window secured to the belt to close the opening and to create a monitoring channel in the belt the monitoring window comprising a flexible material adapted to flex with the belt as the belt moves in use;
 (b) determining a removal rate of a substrate undergoing chemical-mechanical polishing by the belt; and then (c) adjusting polishing process parameters to optimize the removal rate.

14. The invention of claim 13 further comprising:

(d) determining removal rate variation; and then (e) adjusting polishing process parameters to optimize uniformity.

15. The invention of claim 13, wherein the flexible material comprises urethane.

16. The invention of claim 7 further comprising a film thickness monitor secured with respect to the rollers.

17. The invention of claim 16, wherein the film thickness monitor is disposed at least partially within a region bounded by the belt.

18. The invention of claim 16, wherein the polishing device further comprises a platen stationary with respect to the belt and having an opening formed therein, and wherein the film thickness monitor is disposed at least partially within the opening formed in the platen.

19. The invention of claim 16, wherein the film thickness monitor comprises an interferometer.

20. The invention of claim 13, wherein removal rate is determined in (b) using a film thickness monitor disposed adjacent the belt.

* * * * *

UNITED STATES PATENT AND TRADEMARK OFFICE
CERTIFICATE OF CORRECTION

PATENT NO. : 6,261,155 B1
DATED : July 17, 2001
INVENTOR(S) : Rahul Jairath et al.

It is certified that error appears in the above-identified patent and that said Letters Patent is hereby corrected as shown below:

Claim 13,
Line 5, immediately after "belt" insert -- , -- (comma).

Signed and Sealed this

Twenty-sixth Day of March, 2002

Attest:

JAMES E. ROGAN
Attesting Officer  Director of the United States Patent and Trademark Office